United States Patent
Young et al.

(12)

(10) Patent No.: US 6,812,120 B1
(45) Date of Patent: Nov. 2, 2004

(54) METHOD OF FORMING FLOATING GATE OF MEMORY DEVICE

(75) Inventors: Rex Young, Hsinchu (TW); Pin-Yao Wang, Hsinchu (TW)

(73) Assignee: Powerchip Semiconductor Corp., Hsinchu (TW)

(*) Notice: Subject to any disclaimer, the term of this patent is extended or adjusted under 35 U.S.C. 154(b) by 0 days.

(21) Appl. No.: 10/708,351

(22) Filed: Feb. 26, 2004

(51) Int. Cl.[7] .......................................... H01L 21/8247
(52) U.S. Cl. ...................... 438/589; 438/594; 438/259; 438/963; 438/704
(58) Field of Search ................................ 438/257–267, 438/589, 593–594, 963, 704

(56) References Cited

U.S. PATENT DOCUMENTS 6,093,606 A * 7/2000 Lin et al. ..................... 438/259
6,281,103 B1 * 8/2001 Doan .......................... 438/593
6,429,075 B2   8/2002 Yeh et al. ..................... 438/260
6,639,269 B1 * 10/2003 Hofmann et al. ........... 257/316
6,720,219 B2 * 4/2004 Huang .......................... 438/264
2003/0219943 A1 * 11/2003 Lin et al. ..................... 438/257
2004/0097036 A1 * 5/2004 Hsiao et al. ................. 438/257

* cited by examiner

*Primary Examiner*—Richard A. Booth
(74) *Attorney, Agent, or Firm*—Jiang Chyun IP Office

(57) ABSTRACT

A method of forming a floating gate of a memory cell is provided. A substrate having at least a trench is provided. Next, a tunnel oxide layer is formed on a surface of the trench. Next, a conductive layer is filled in the trench. Next, two-step etching process is carried out to form a first floating gate and a second floating gate having a top corner with sharp edge over the sidewalls of the trench.

10 Claims, 4 Drawing Sheets

METHOD OF FORMING FLOATING GATE OF MEMORY DEVICE

BACKGROUND OF INVENTION

1. Field of the Invention

The present invention generally relates to a method of forming a memory device. More particularly, the present invention relates to a method of forming a floating gate of a memory device.

2. Description of the Related Art

In recent years, flash memory device has become the main stream of the non-volatile memory device because flash memory device allows multiple data writing, loading and erasing operations. In addition, stored data can be preserved even when the power supply of the memory device is removed.

In a conventional flash memory device, generally the floating gate and the control gate of a stacked gate structure are manufactured with doped polysilicon. Moreover, the floating gate and the control gate are separated by an inter-gate dielectric layer. In addition, the floating gate and the substrate are separated by a tunnel oxide layer.

For writing data in a flash memory, a bias voltage is applied to the control gate and the source/drain regions so that electrons are injected into the floating gate. For reading data stored in the flash memory, an operating voltage is applied to the control gate, and the charging condition of the floating gate will effect the on/off state of the channel corresponding to the binary data "0" or "1". For erasing data stored in the flash memory, the voltage of the substrate, drain (source) or the control gate is raised so that electrons in the floating gate will move into the substrate or drain (source) via the tunnel oxide layer due to the tunneling effect. The erasing method is generally known as "substrate erase" or "drain (source) side erase". Alternatively, electrons in the floating gate can also move into the control gate via the inter-gate dielectric layer.

However, when a data erasure operation of a flash memory is performed, since the amount of the electrons drained from the floating gate is not easy to control, if the electrons are overly drained, the floating gate will be positively charged, and this condition is so-called the over erase. When the floating gate is extremely overly erased, the channel under the floating gate will be in continuously conducting state even when the operating voltage is not applied, and thus the error in the data may occur. Therefore, in order to resolve the over erase problem, a split gate is provided to the flash memory, i.e., a select gate (or erase gate) is disposed on the sidewall of the control gate and floating gate. Moreover, another inter-gate dielectric layer is disposed between the select gate and the control gate, and between the floating gate and the substrate. Therefore, when the over erase problem occurs and that the channel under the floating gate is conducted even when the operating voltage is not applied to the control gate, the channel under the select gate is in off-state. Therefore, the drain and source are not conducted and the error in the data can be effectively prevented.

However, if the shape of the corner of both sides of the floating gate is not sharp enough, when a data erasing operation of the flash memory is performed, the electric field on the corner of both sides of the floating gate is not high enough, and therefore a longer time is required for erasing the data. Conventionally, several methods for improving the shape of the corner of the floating gate are provided, for example, one such method is being disclosed in the U.S. Pat. No. 6,429,075. Referring to FIG. 1 and FIG. 2, a conventional memory device including a first isolation layer 20, a substrate 12, a floating gate 22 and a second isolation layer 26 is provided. The first isolation layer 20 is disposed over the substrate 12, the floating gate 22 is disposed over the first isolation layer 20, and the second isolation layer 26 is disposed over the floating gate 22. Next, a thermal oxidation process is performed under a temperature of about 800° C. to 900° C. to form a silicon oxide layer 27, and as shown in FIG. 2, a sharp corner 29 is formed on a corner of both side of the floating gate 22. However, since the temperature of the thermal oxidation process is performed at a high temperature, and therefore the thermal budget of the thermal process is high. Accordingly, the method described above is not ideal. Furthermore, in the process of forming trench of memory cells, the thermal oxidation process for growing the silicon oxide layer cannot be easily controlled.

SUMMARY OF INVENTION

Accordingly, one object of the present invention is to provide a method of forming a floating gate of a memory device having a capability of promoting the erasing speed.

In accordance with the above objects and other advantages of the present invention, a method of forming a floating gate of a memory device is provided. A substrate having at least an active region, a device isolation structure, a pad layer formed over the active region, a mask layer formed over the pad layer, and a trench formed in the mask layer, the pad layer and the substrate. A tunnel oxide layer is formed on a surface of the trench, and a conductive layer is filled within the trench. Next, an isotropic etching process is performed to remove a portion of the conductive layer such that a shape of a top surface of a remaining conductive layer within the trench has a concave shape profile. Next, an anisotropic etching process is performed to remove a portion of the conductive layer within the trench. According to an embodiment of the present invention, during the anisotropic etching process, polymer residues are generated as byproduct, which gets deposited on a sidewall of the trench and serves as an etching mask. The anisotropic etching is continued until a portion of the tunnel layer is exposed. Next, the byproduct polymer residues are removed to form a first floating gate and a second floating gate on a sidewall of the trench, wherein a top corner of the first floating gate and the second floating gate has a sharp edge.

According to an embodiment of the present invention, the floating gate having a top corner with a sharp edge is formed in a two-etching step process. According, a thermal oxidation process for forming the sharp top corner of the floating gate as in the case of the conventional process can be effectively avoided. Further, the deposition of the polymer residues generated during the second etching process deposited on the sidewall in a self-aligned manner and serves as an etching mask protecting the contour of the top corner of the floating gate.

Furthermore, the top corner of the first floating gate or the second floating gate of the present invention has a sharp edge. Thus, when the flash memory cell of the present invention performs the erasing of data, the sharp edge can generate a higher electric field so that the electrons can be drained out from the sharp edge. Therefore, the time required for erasing data can be substantially reduced, and also the voltage required for the erasing can be substantially reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The following drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
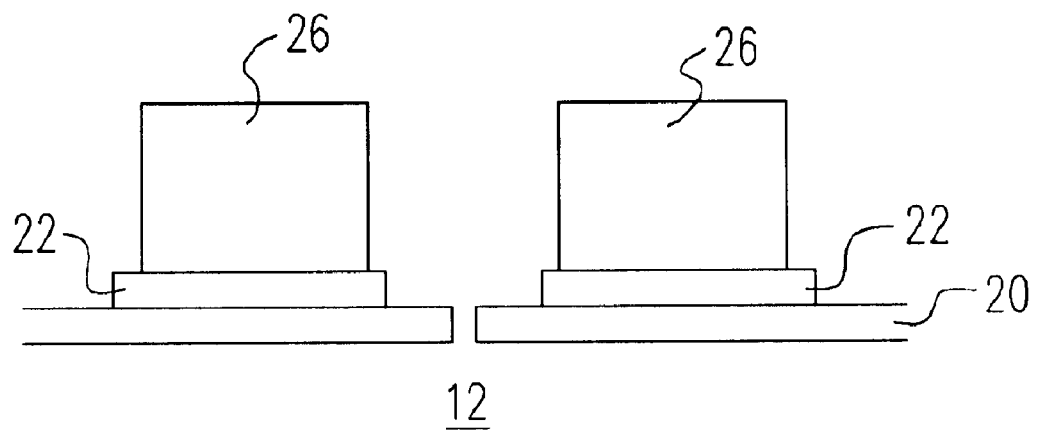
FIG. 1 is a cross-sectional view schematically illustrating a structure of a conventional flash memory cell.
Figure 2:
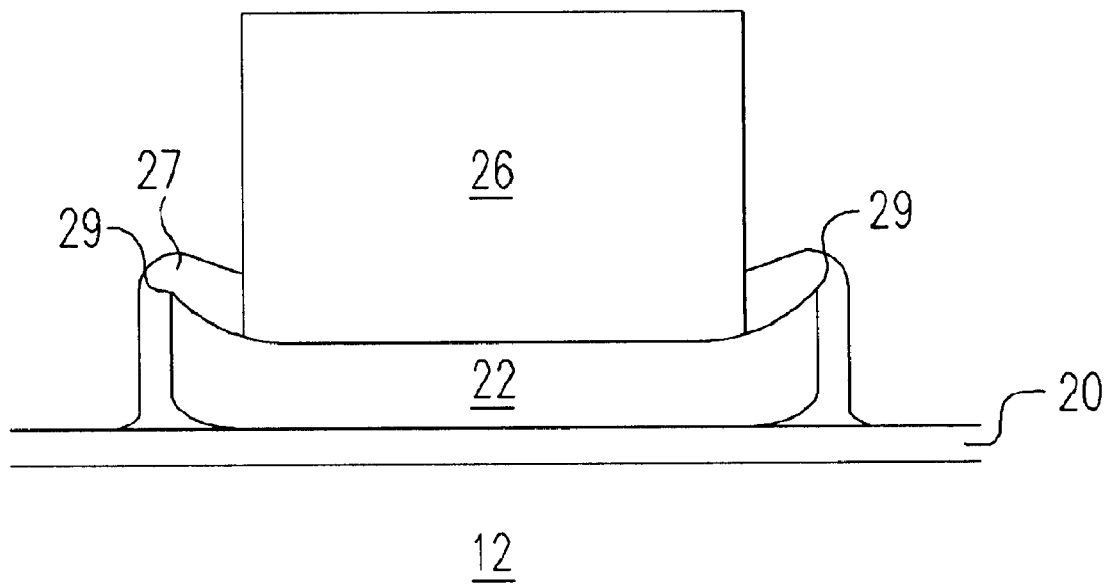
FIG. 2 is a cross-sectional view schematically illustrating the structure of the flash memory cell shown in FIG. 1 after a thermal oxidation process.
Figure 3:
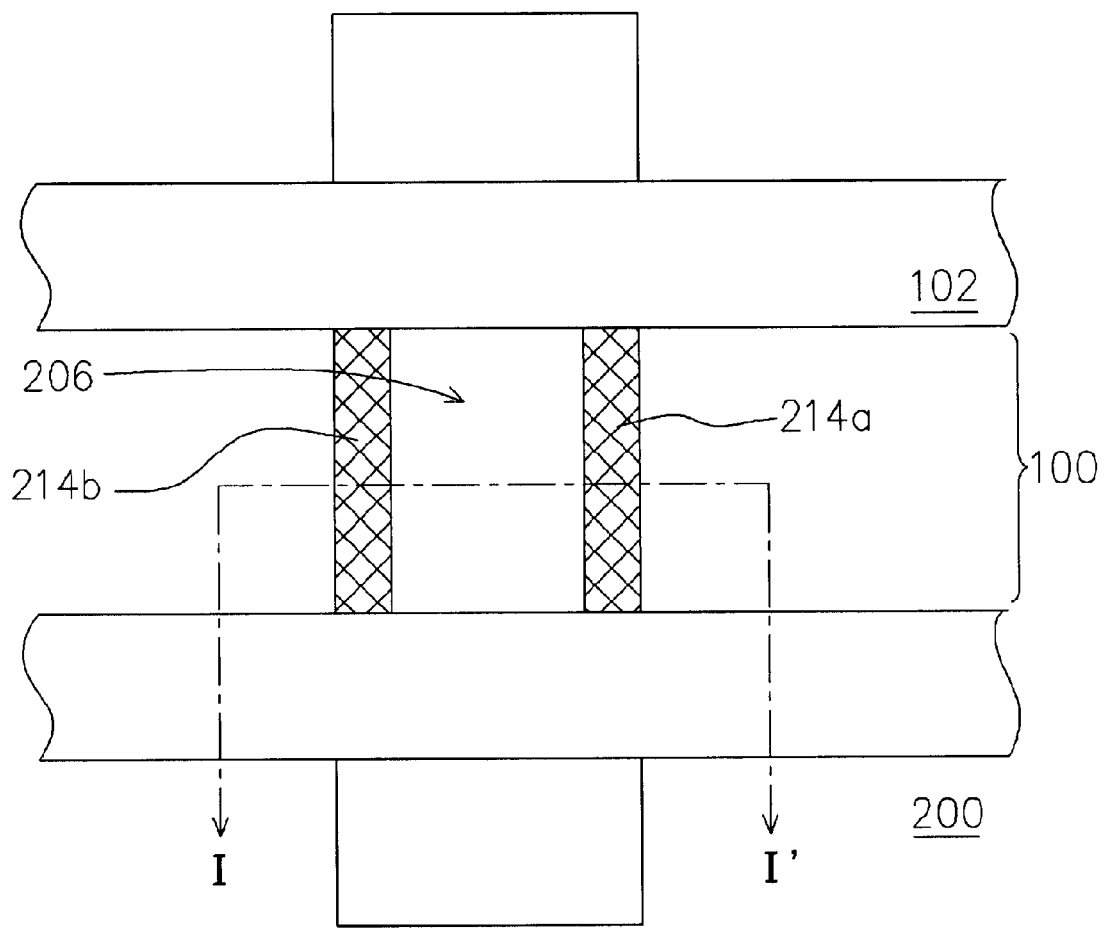
FIG. 3 is a top view schematically illustrating a floating gate of a flash memory cell according to a preferred embodiment of the present invention.

FIG. 3 is a top view schematically illustrating a floating gate of a flash memory cell according to a preferred embodiment of the present invention. FIG. 4A to FIG. 4D are cross-sectional views along the line I to I of FIG. 3 schematically illustrating the process of forming a floating gate of a flash memory according to a preferred embodiment of the present invention.

Figure 4A:
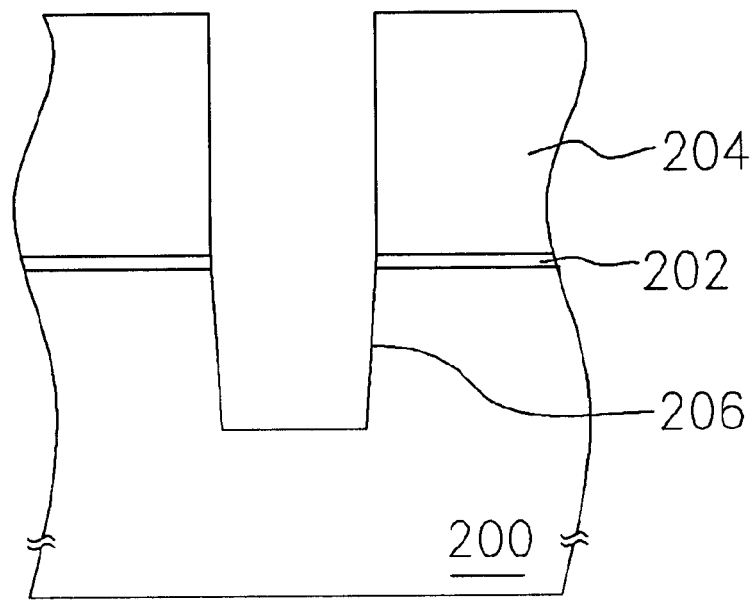
FIG. 4A to FIG. 4D are cross-sectional views along the line I to I of FIG. 3 schematically illustrating a process of forming a floating gate of a flash memory cell according to a preferred embodiment of the present invention.

Referring to FIG. 3 and FIG. 4A, a substrate 200 including at least an active region 100 and a device isolation structure 102 is provided. The substrate 200 includes, for example but not limited to, a silicon substrate. The device isolation structure 102 is, for example but not limited to, a field oxide isolation structure or shallow trench isolation (STI) structure. Next, a pad layer 202 is formed on a surface of the substrate 200, wherein the pad layer 202 includes, for example but not limited to, a silicon oxide layer. The pad layer 202 is formed by performing, for example but not limited to, a thermal oxidation process. Next, a mask layer 204 is formed on the pad layer 202, wherein the mask layer 204 includes, for example but not limited to, a silicon nitride layer. The mask layer 204 is formed by performing, for example but not limited to, a chemical vapor deposition (CVD) process. Next, a standard photolithography and etching process are carried out to etch portions of the mask layer 204, the pad layer 202 and the substrate 200 to form trench 206 in the active region 100 of the substrate 200.

Figure 4B:
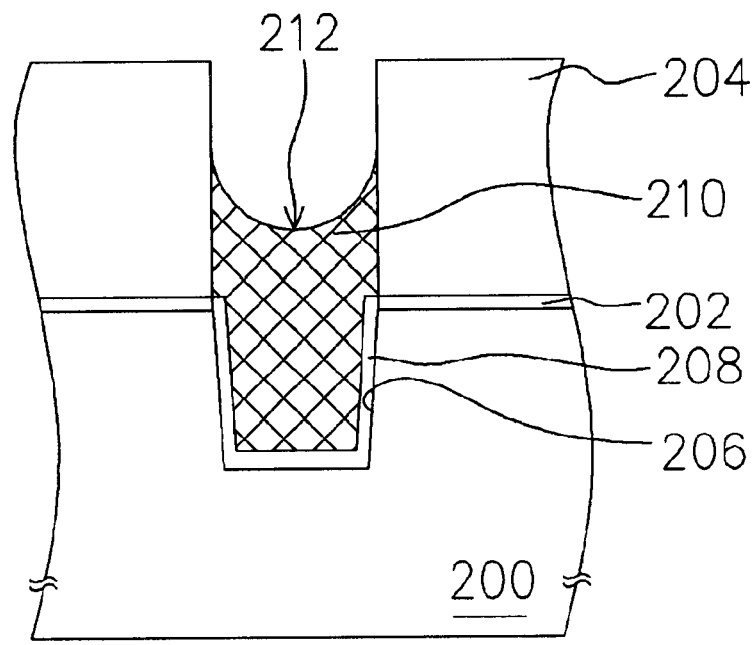

Next, referring to FIG. 4B, a tunnel oxide layer 208 is formed on the surface of the trench 206. The tunnel oxide layer 208 includes, for example but not limited to, a silicon oxide layer, and the tunnel oxide layer 208 can be formed by performing, for example but not limited to, a thermal oxidation process. Next, a conductive layer is formed over the substrate 200 filling the trench 206, wherein the conductive layer includes, for example but not limited to, a polysilicon layer or a doped polysilicon layer. The method forming of the dope polysilicon layer includes, for example but not limited to, forming an undoped polysilicon layer by performing a chemical vapor deposition (CVD) process, and then implanting suitable dopants into the undoped polysilicon layer. Next, an etching back process is performed to remove a portion of the conductive layer within the trench until a top surface of the remaining conductive layer 210 is lower than a top surface of the mask layer 204. The etching back process includes, for example but not limited to, a dry etching process or a chemical mechanical polishing (CMP) process. Thereafter, a first etching process is performed to remove another portion of the conductive layer, wherein a top surface 212 of the remaining conductive layer 210 has a concave shape. The first etching step is, for example but not limited to, an isotropic etching step including wet etching process. The wet etching process is performed using, for example but not limited to, a solution consisting of ammonia water, hydrogen peroxide and deionized water (ammonium hydrogen peroxide mixture, "APM").

Figure 4C:
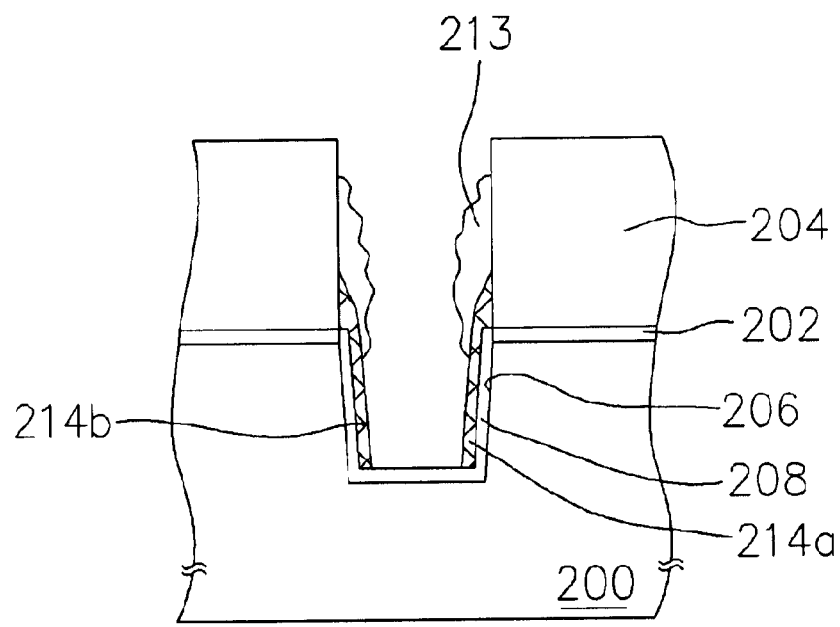

Next, referring to FIG. 4C, a second etching step is performed to remove a portion of the conductive layer 210 until a portion of the pad layer 202 is exposed. Then, a pair of spacers of the remained conductive layer are formed on the sidewalls not adjacent to the device isolation structure. According to an embodiment of the present invention, during the second etching process, polymer residues 213 are generated as a byproduct adhering to the sidewalls and serves as an etching mask. Consequently, a remaining portion of the conductive layer 210 over the sidewalls of the trench 206 form floating gates 214a and 214b. It is noted that, the second etching step includes, for example but not limited to, an anisotropic plasma etching process using a reaction gas mixture including chlorine ($Cl_2$)/hydrogen bromide (HBr)/oxygen ($O_2$). During the second etching step, polymer residues 213 is generated as byproduct, and this polymer residues 213 deposits on the sidewalls in a self aligned manner covering a portion of the remaining conductive layer and top corners 216. The polymer residues 213 serves as an etching mask during the second etching step, and also protects the sharp contour of the top corners 216 from damage during the second etching step. Moreover, it is to be noted that the amount of polymer residues 213 generated is directly proportional to the ratio of the hydrogen bromide, i. e. the amount of polymer residues 213 increases with the increase in the ratio of the hydrogen bromide. Accordingly, the etching reaction condition can be suitably adjusted to protect the top corners 216.

Figure 4D:
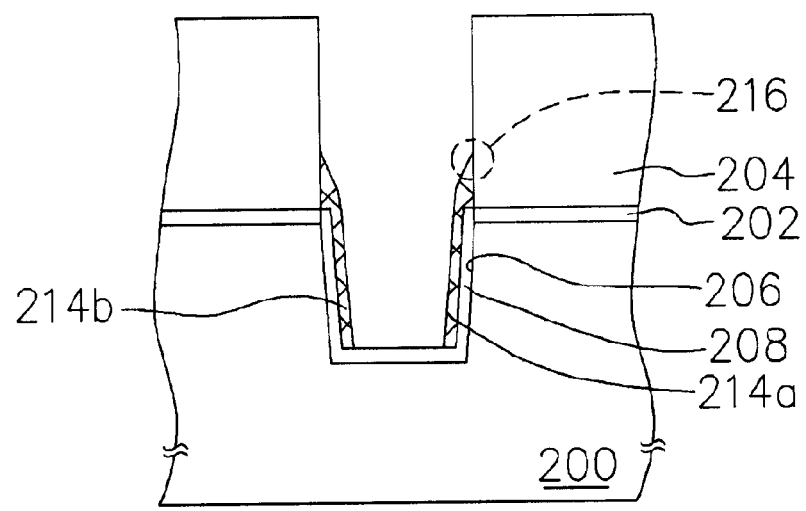

Next, as shown in FIG. 4D, the polymer residues 213 are removed and the remaining conductive layer on the sidewalls form floating gates 214a and 214b, in which the top corner 216 has a sharp edge. Then, the conventional process of forming the components of a flash memory cell including, for example but not limited to, source (not shown), drain (not shown), control gate (not shown) and select gate (not shown) may be commenced to complete the fabrication of a flash memory cell. Since the technology of forming these components is well known to those skilled in the art, it is no more described hereinafter.

Accordingly, in the embodiments of the present invention, the floating gate having a top corner with a sharp edge is fabricated by a two-step etching process. Therefore, a thermal oxidation process for forming the sharp corner as in the case of the conventional process can be effectively avoided. Moreover, during the second etching step, the byproduct polymer residues are generated and deposited on the sidewalls in a self-aligned manner so as to cover the top corners of the floating gates and serve as an etching mask. Therefore, the polymer residues are capable of protecting the contour of the top corners of the floating gates.

Because the top corners of the floating gates of the present invention have sharp edges, the sharp edges generate a higher electric field during the data erasing. Hence, the electrons can be drained out from the sharp edges very quickly. Therefore, the time required for erasing data can be substantially reduced, and the voltage applied for the erasing can also be substantially reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a floating gate, comprising:
   providing a substrate having at least a device isolation structure, an active region defined by the device isolation structure, a pad layer formed over the active region, a mask layer formed over the pad layer, and a trench formed in the substrate, wherein the trench penetrates through the pad layer and the mask layer;
   forming a tunnel oxide layer on a surface of the trench;
   forming a conductive layer in the trench;
   removing a portion of the conductive layer by an isotropic etching process, wherein a top surface of a remaining conductive layer is concave;
   etching the remaining conductive layer until a portion of the tunnel oxide layer is exposed by an anisotropic etching process, wherein byproduct polymer residues are generated and serve as a mask during the anisotropic etching process; and
   removing the byproduct polymer residues, the mask layer and the pad layer so a to form a first floating gate and a second floating gate having sharp top-corners over a plurality of sidewalls of the trench.

2. The method of claim 1, wherein the isotropic etching process comprises a wet etching process.

3. The method of claim 2, wherein the wet etching process is performed by using a solution consisting of ammonia water, hydrogen peroxide and deionized water.

4. The method of claim 1, wherein the anisotropic etching process comprises a plasma etching process.

5. The method of claim 4, wherein the plasma etching process is performed by using chlorine/hydrogen bromide/oxygen as a reaction gas.

6. The method of claim 1, wherein the concave surface of the remaining conductive layer is higher than a surface of the pad layer.

7. The method of claim 1, wherein the substrate comprises a silicon substrate.

8. The method of claim 1, wherein the conductive layer comprises a polysilicon layer.

9. The method of claim 1, wherein the mask layer comprises a silicon nitride layer.

10. The method of claim 1, wherein the pad layer comprises a silicon oxide layer.

* * * * *